VAPOR GROWN SEMICONDUCTOR DEVICE

Filed Dec. 31, 1959

INVENTORS
JOHN C. MARINACE
RICHARD F. RUTZ

BY Alvin J. Riddles
ATTORNEY 3,014,820
VAPOR GROWN SEMICONDUCTOR DEVICE

John C. Marinace, Yorktown Heights, and Richard F. Rutz, Fishkill, N.Y., assignors to International Business Machines Corporation, New York, N.Y., a corporation of New York Filed Dec. 31, 1959, Ser. No. 863,318
9 Claims. (Cl. 148—1.5)

This invention relates to semiconductor devices and in particular to the formation of semiconductor crystals by the deposition of semiconductor material epitaxially on a monocrystalline substrate of semiconductor material.

Up to the present time, the fabrication of semiconductor bodies for construction into devices such as transistors and diodes has first involved the introduction of conductivity type determining impurities into a monocrystalline body of semiconductor material in various concentrations and gradients of concentrations and then a subsequent cutting or shaping of portions of the crystal into device bodies with critical dimensions. In addition to closely controlled overall dimensions, certain semiconductor devices such as the drift transistor, require a close correlation between the gradient of conductivity type determining impurities and the physical dimensions of the device between one junction and another. Such devices require very complicated process steps in the art to achieve.

Semiconductor bodies for devices have recently been made by the technique of vapor deposition wherein the semiconductor material is deposited on a monocrystalline substrate of semiconductor material in such a manner that an epitaxial deposit results wherein the same atomic periodicity and crystal structure as the substrate is retained. The vapor deposition is accomplished by the decomposition of a halide compound of the semiconductor material. This technique is described in copending application Serial No. 809,957, filed April 30, 1959, and assigned to the assignee of this invention.

The technique of epitaxial vapor deposition is valuable for its many precise control advantages. Since the deposition occurs at a very slow rate, specific dimensions are readily achieved and the deposition reaction is adapted to the selected inclusion of an impurity so that the correlation of the concentration of the conductivity type determining impurities and the physical dimensions between junctions in the deposited crystal is readily achieved.

A problem has been encountered with this type of semiconductor device fabrication technique due to the fact that there is a certain amount of delay in the incorporation of a given concentration of conductivity type determining impurity into the crystal being deposited from the time that the impurity is introduced into the vapor being decomposed and the position in the deposited crystal wherein the desired impurity concentration is established. In other words, when in the course of growing a crystal of a given resistivity it becomes desirable to change the impurity present in the vapor to thereby switch to a different conductivity type at a particular resistivity, a certain time is required to reach the proper concentration and during that time the crystal continues to grow, so that there is a section in the deposited crystal wherein the desired conductivity type determining impurity concentration is not present.

What has been discovered is a technique of epitaxial vapor deposition of semiconductor material whereby abrupt changes from one conductivity type determining impurity concentration to another in a deposited crystal may be achieved, and the desired concentration of conductivity type determining impurities may be established at all points in the crystal. The technique of the invention employs a controlled temperature exhaust zone in connection with a pyrolytic halide semiconductor compound decomposition type of deposition.

With the technique of this invention, it is possible to achieve with epitaxial vapor deposition, semiconductor bodies having sufficiently high concentrations of conductivity type determining impurities to impart the property of degeneracy to the semiconductor material, and, to provide sufficiently abrupt junctions between regions of degenerate material so that devices exhibiting the quantum mechanical tunneling effect of the "Esaki" or "tunnel" diode may be constructed.

It is an object of this invention to provide a method of achieving in an epitaxial vapor deposition process an abrupt change in the conductivity of the deposited semiconductor crystal.

It is another object of this invention to provide an exhaust zone in an epitaxial vapor deposition process.

It is another object of this invention to provide a method of producing by vapor depositing, "Esaki" or "tunnel" diodes.

It is another object of this invention to provide a method of forming a narrow semiconductor junction in an epitaxial vapor deposited structure.

The foregoing and other objects, features, and advantages of the invention will be apparent from the following more particular description of the invention as illustrated in the accompanying drawing.

The invention involves providing in a sealed tube epitaxial vapor deposition process, a zone in which the ingredients of an earlier deposition condition may be rapidly transferred so that a desired concentration of a different conductivity type determining impurity condition in the vapor over the substrate may be established quickly during a minimum of crystalline deposition or growth.

Figures 1, 2:
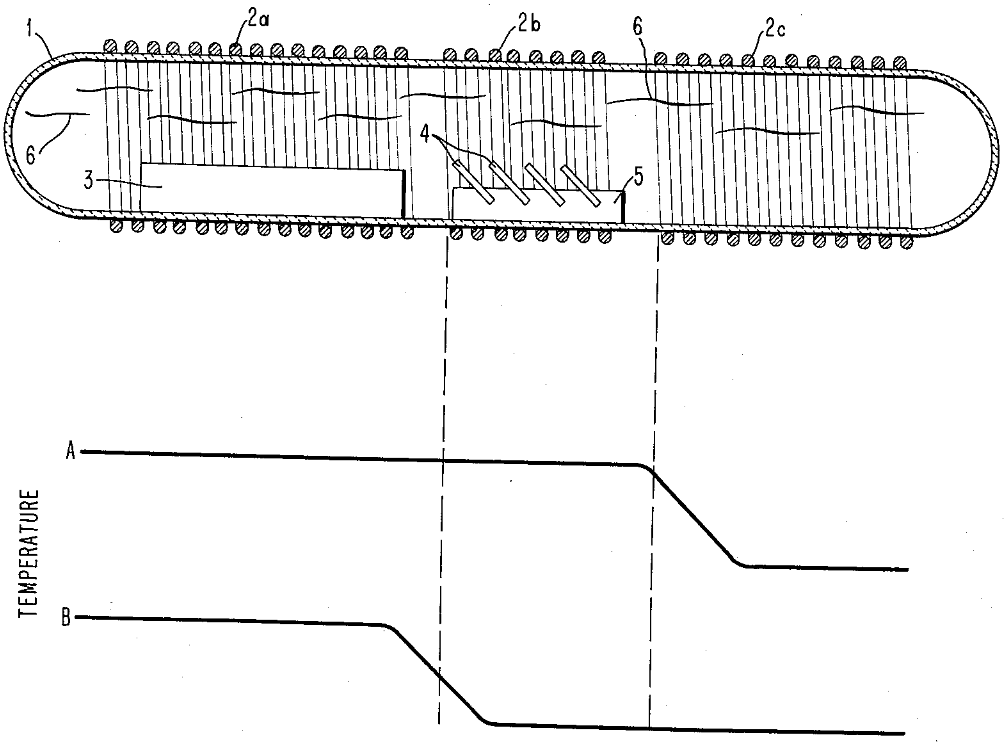
FIG. 1 is a schematic view of a container illustrating the epitaxial deposition reaction of the invention.
FIG. 2 is a series of graphs indicating temperature relationships in FIG. 1.

Referring now to FIG. 1, an environment controlling container 1 of quartz or similar refractory material is provided with a plurality of heat controlled zones. The temperature in these zones may be controlled by providing windings 2*a*, 2*b*, and 2*c* of, for example, Nichrome wire through which power, not shown, may be applied in a controlled quantity to establish a given temperature within the zone. Within the zone controlled by 2*a*, a quantity 3 of the semiconductor material that is ultimately to be deposited is positioned. This quantity may be referred to as the source. The quantity is shown as an ingot of semiconductor material; however, there is no restriction on the form of the source material. A conductivity type determining impurity of a particular conductivity type desired to be included in the deposited crystal is included in the material 3, although as has been described in the above described copending applications, it is also possible to position a source of conductivity type determining impurity in a separately controlled heat zone in the container. A transport element not labelled, generally a halogen such as iodine, is included in the container and is vaporized by the heat applied through the coils 2*a*, 2*b*, and 2*c*.

The substrate 4 on which the deposition is to take place is positioned at another discrete temperature zone 2*b* in the container 1. The substrate 4 is of material capable of providing the crystalline periodicity for the deposited epitaxial crystal growth. In order to illustrate simultaneous formation of a plurality of elements, the substrate is illustrated as a plurality of wafers 4 of monocrystalline semiconductor material positioned in a fixture 5 which facilitates circulation of a vapor 6 around their surfaces. A separate zone, the temperature in which is controlled by element 2*c*, is unoccupied for purposes to be later explained.

In the deposition reaction, the temperature under the zone 2*a* is raised so that the semiconductor material 3 and the transport element combine to form a vaporized compound labelled element 6. The temperature in the region of the substrates 4 under the zone 2*b* is then established at a temperature different from that of the source material 3 so that the vapor 6 decomposes yielding free semiconductor material which deposits epitaxially on the substrate 4.

In accordance with the invention, the temperature of the zone 2*c* is dropped to the vicinity of the temperature of 2*b* at any time when it is desirable to sweep the vapor out of the vicinity of the substrates 4, as for example, when changing conductivity type. This is particularly valuable in forming a narrow junction in a highly doped semiconductor device such as that required for an "Esaki" or "tunnel" diode. The zone 2*c* operates to arrest the growth until the desired impurity concentration is built up in the vapor.

It will be apparent to one skilled in the art that where the conductivity type determining impurities are introduced to the vapor 6 through separately heated zones, consideration must be given to vapor pressures and physical chemistry in establishing proper concentrations of the particular impurity in the vapor that will result in the desired resistivity in the deposited crystal. Where the tube 1 is of relatively small physical size, it has been found difficult at the present stage of the technology to provide closely spaced controlled heat zones with substantial differences in temperature as would be required where one conductivity type determining impurity was arsenic, which is relatively volatile and another impurity was boron, which is not considered volatile. In order to simplify the reaction tube structure and control it, it has been found preferable, as is illustrated, to include the conductivity type determining impurity in the source of semiconductor material in a concentration capable of resulting in the desired concentration in the deposited crystal.

The invention is further illustrated in connection with the graph in FIG. 2, depicting the pyrolytic disproportionation reaction for germanium and iodine. While the specific reaction has not definitely been established, the reaction is as shown in Equation 1.

EQUATION 1

$$2GeI_2 \rightarrow Ge + GeI_4$$

The free germanium is deposited on the substrate when the substrate is maintained at the lowest temperature point in the tube.

In first preparing for deposition the temperature is raised under the semiconductor material 3, and the substrate wafers 4, and the temperature is lowered at the zone 2*c*. During the preparation time, some of the semiconductor material from the source 3 is removed and a certain amount of etching or removal of semiconductor material from the substrate wafers 4 takes place thereby presenting all clean surfaces for deposition. The temperature profile in the tube 1 for this preparation operation is depicted by curve A of FIG. 2 wherein the source 3 and the substrate wafers 4 are shown at an elevated temperature, and the exhaust zone 2*c* is shown at a lower temperature.

At the end of the preparation time, deposition from the source 3 is set up. The temperature at zones 2*b* and 2*c* is maintained at a lower temperature, and the source 3 is established at the high temperature for inclusion in the vapor 6. These conditions are depicted by curve B in FIG. 2. Under these conditions, at the higher temperature, the semiconductor 3 is included in the vapor 6, and the vapor 6 decomposes at the nearby lower temperature region over the substrate wafers 4, forming a deposit of semiconductor material epitaxially thereon. For purposes of illustration, assume that the substrate wafers 4 are of highly doped P type material and that the source semiconductor material 3 contains a high concentration of N conductivity type determining impurities, so that an N conductivity type region will be abruptly formed on each of the P type substrate wafers 4.

The deposition technique of the invention makes possible the deposition of semiconductor structures having a PN junction exhibiting a quantum mechanical tunneling effect which results in a potential-current characteristic with a negative resistance in the forward direction. This device is known in the art as the "Esaki" or "tunnel" diode. Such a device is made up of two regions of opposite conductivity type forming a PN junction in a monocrystalline semiconductor body. The P and N regions of the body have a conductivity type determining impurity concentration sufficiently high that the semiconductor material is unaffected by temperature changes. This property is known in the art as degeneracy. The PN junction in the body is very narrow or, in other words, the resistivity rises abruptly at the junction. Such a structure is extremely difficult to produce since quantities of conductivity type determining impurities are involved that are near the maximum that the crystal will accept and the high impurity level must be rapidly established to form the narrow PN junction. In order to impart a realization of the orders of magnitude involved, consider the fact that in germanium, one of the more thoroughly investigated semiconductor materials, degeneracy occurs at doping levels on the order of $10^{19}$ atoms per cc., which is about one impurity atom per 1000 crystal atoms and the PN junction must be on the order of 150 angstrom units in thickness.

Through the use of the exhaust zone in this invention no appreciable deposition takes place while a vapor concentration is being established so that narrow junctions between regions of extremely high impurity concentration can be formed.

Figure 3:
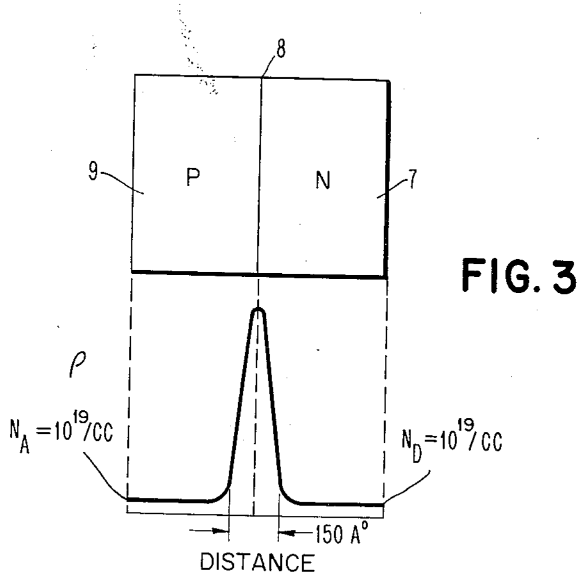
FIG. 3 is a sketch of a semiconductor crystal containing a PN junction accompanied by a dimensionally correlated resistivity plot showing the type of junction produced employing the invention.

Referring next to FIG. 3, a sketch is shown of a semiconductor device which has been made in accordance with the invention. In FIG. 3, an N region 7 is joined at a PN junction 8 with a P region 9. Along with the structure of FIG. 3 is a dimensionally correlated resistivity plot illustrating the narrowness of the junction and the high impurity concentration that result in the quantum mechanical tunneling type of performance of the "Esaki" or "tunnel" diode.

In a semiconductor device as shown in FIG. 3, the conductivity type of the semiconductor material is governed by the predominance of one conductivity type determining impurity over the other in a region and the resistivity is governed by the net concentration of that one conductivity type over the other. As may be seen from the diagram, as a PN junction is formed, the resistivity, which is a measure of the net concentration of one conductivity type over the other, is at its greatest value when the conductivity types are essentially in balance. This is illustrated by the fact that the resistivity curve forms a cusp at the PN junction. The gradualness of the slope of the curves on each side of the junction is a measure of what is known as the "width of the junction" or the distance from one heavily doped region to another. The width of this junction is an important consideration in semiconductor devices such as those exhibiting the quantum mechanical tunneling phenomenon and those employed as parametric amplifiers.

Previously in the art, it was very difficult to cause an abrupt change in conductivity type impurity concentrations so as to provide a narrow junction, but through the employing of the exhaust zone 2c in connection with this invention, such junctions are readily fabricated, and a further advantage is achieved in that it has been found that a lower temperature may be employed for the substrate wafers 4 so that there is a minimum of diffusion which would tend to raise and change the shape of the resistivity curve in the substrate zone 7 of FIG. 3.

In order to provide a starting place for one skilled in the art in practicing the invention, the following set of specifications for a deposition process as described in FIGS. 1 and 2 is provided in which PN structures of degenerate semiconductor material as described in FIG. 3 are fabricated, it being understood that no limitation should be construed hereby, since in the light of the above description, many such sets of specifications will be apparent to one skilled in the art.

| | |
|---|---|
| Tube **1** | 10 cm. diameter; 10 in. long. |
| Semiconductor material **3** | Germanium 20–50 gm. ingot containing as a conductivity type impurity phosphorus or antimony in a concentration in the vicinity of $10^{19}$ atoms per cu. cm. |
| Substrate **4** | Germanium wafers cut with their faces parallel to the 111 crystallographic plane and containing a concentration of gallium in the vicinity of $10^{19}$ atoms per cu. cm. |
| Transport element | Iodine at a pressure of 100 mm. of Hg. |

Referring to FIGS. 1 and 2:

| Curve A— | ° C., approximately |
|---|---|
| Zone **2a** | 550 |
| Zone **2b** | 550 |
| Zone **2c** | 550 |

| Curve B— | |
|---|---|
| Zone **2a** | 300 |
| Zone **2b** | 300 |
| Zone **2c** | 300 |

What has been described is a technique of vapor depositing semiconductor crystals wherein the crystal growth is arrested through the use of an exhaust zone in connection with the reaction so that abrupt changes in high concentrations of conductivity type determining impurities may be achieved.

While the invention has been particularly shown and described with reference to a preferred embodiment thereof, it will be understood by those skilled in the art that various changes in form and details may be made therein without departing from the spirit and scope of the invention.

What is claimed is:

1. In a method of sealed tube vapor depositing of semiconductor material involving decomposition of a halogen compound of said semiconductor material the step of exhausting the ingredients of the decomposition reaction into a separate region during establishment of a particular concentration of ingredients in said decomposition reaction.

2. In a method of sealed tube vapor depositing semiconductor material involving the pyrolytic decomposition of a halogen compound of said semiconductor material, the step of exhausting the ingredients of the pyrolytic decomposition reaction into a separate region maintained at a temperature favorable to said pyrolytic decomposition during establishment of a particular concentration of ingredients in said decomposition reaction.

3. In a method of sealed tube vapor depositing semiconductor material involving the pyrolytic decomposition of a halogen compound of said semiconductor material, the step of exhausting the ingredients of the pyrolytic decomposition reaction into a separate region maintained at the lower temperature decomposition location in said sealed tube during establishment of a particular concentration of ingredients in said pyrolytic decomposition reaction.

4. The method of forming semiconductor bodies comprising the steps of: providing in a sealed container at least one substrate of semiconductor material in contact with a vapor of a decomposing compound of a transport element and a semiconductor material, establishing a temperature controllable exhaust zone in said container, and maintaining the exhaust zone at the temperature for decomposition of said vapor in said container at one time and maintaining the substrate at the temperature for decomposition of said vapor in the container at another time.

5. The method of forming semiconductor bodies comprising the steps of: providing in a sealed container at least one monocrystalline germanium substrate in contact with a vapor of a decomposing compound of a transport element and germanium, establishing a temperature controllable exhaust zone in said container, and maintaining the exhaust zone at the temperature for decomposition of said vapor in said container at one time and maintaining the substrate at the temperature for decomposition of said vapor in the container at another time.

6. The method of forming semiconductor bodies comprising the steps of: providing in a sealed container at least one monocrystalline germanium substrate in contact with a vapor of a decomposing compound of iodine and a germanium, establishing a temperature controllable exhaust zone in said container, and maintaining the exhaust zone at the temperature for decomposition of said vapor in said container at one time and maintaining the substrate at the temperature for decomposition of said vapor in the container at another time.

7. The method of forming semiconductor bodies containing a quantum mechanical tunneling type of PN junction by vapor deposition comprising the steps of: providing a sealed container including a first source of degenerate one conductivity type semiconductor material, a degenerate substrate of the opposite conductivity type semiconductor material and an exhaust zone each in separate temperature controllable locations within said container, means establishing a first temperature profile wherein said degenerate substrate and said first degenerate semiconductor source all at the higher temperature in the container and said exhaust zone is in the lower temperature for a period of time sufficient to deposit a portion of said first degenerate semiconductor material and a portion of said degenerate substrate in said exhaust zone and to establish a steady concentration in said vapor and establishing a second temperature profile within said container wherein said degenerate source of semiconductor material is at the highest temperature and said degenerate substrate is at the deposition temperature.

8. The method of forming germanium semiconductor bodies containing a "tunneling" type of PN junction by vapor deposition comprising the steps of: providing a sealed container including a first source of N conductivity type germanium containing sufficient conductivity type determining impurities to be degenerate, a degenerate P type germanium substrate and an exhaust zone each in separate temperature controllable locations within said container, means establishing a first temperature profile wherein said degenerate P type germanium and said exhaust zone are at a deposition temperature in said container and said N type source is at a higher temperature point in the container for a period of time sufficient to deposit a portion of said N type germanium and a portion of said degenerate P type germanium substrate in said exhaust zone and to establish a steady vapor concentration and establishing a second temperature profile within said container wherein said degenerate P type germanium substrate is at the deposition temperature.

9. The method of forming germanium semiconductor bodies containing a "tunneling" type of PN junction by vapor deposition comprising the steps of: providing a sealed container including a first source of degenerate phosphorus doped germanium, a degenerate gallium doped germanium substrate and an exhaust zone each in separate temperature controllable locations within said container, means establishing a first temperature profile wherein said degenerate gallium doped germanium and said exhaust zone are at a deposition temperature in said container and said degenerate phosphorus doped germanium source is at a higher temperature point in the container for a period of time sufficient to deposit a portion of said degenerate phosphorus doped germanium and a portion of said degenerate gallium doped germanium substrate, in said exhaust zone and to establish a steady vapor concentration and establishing a second temperature profile within said container wherein said degenerate gallium doped germanium substrate is at the deposition temperature.

References Cited in the file of this patent

UNITED STATES PATENTS

| | | |
|---|---|---|
| 2,692,839 | Christensen | Oct. 26, 1954 |
| 2,763,581 | Freedman | Sept. 18, 1956 |
| 2,898,248 | Silvey | Aug. 4, 1959 |

OTHER REFERENCES

Physical Review, vol. 109 (1958), pp. 603–604.

UNITED STATES PATENT OFFICE

CERTIFICATE OF CORRECTION

Patent No. 3,014,820 December 26, 1961

John C. Marinace et al.

It is hereby certified that error appears in the above numbered patent requiring correction and that the said Letters Patent should read as corrected below.

Column 2, line 63, for "applications" read -- application --; column 5, line 45, for "Zone 2c-----550" read -- Zone 2c-----300 --; line 47, for "Zone 2a-----300" read -- Zone 2a-----550 --; column 6, line 37, strike out "a", third occurrence.

Signed and sealed this 19th day of June 1962.

(SEAL)
Attest:

ERNEST W. SWIDER
Attesting Officer

DAVID L. LADD
Commissioner of Patents